United States Patent
Yamada

(10) Patent No.: US 7,508,049 B2
(45) Date of Patent: Mar. 24, 2009

(54) SEMICONDUCTOR OPTICAL DEVICE

(75) Inventor: Takashi Yamada, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 118 days.

(21) Appl. No.: 11/497,524

(22) Filed: Aug. 2, 2006

(65) Prior Publication Data

US 2007/0029542 A1 Feb. 8, 2007

(30) Foreign Application Priority Data

Aug. 4, 2005 (JP) .......................... P2005-226944

(51) Int. Cl.
*H01L 29/20* (2006.01)
(52) U.S. Cl. .............................. 257/615; 257/1; 257/13; 257/201; 257/613; 257/E21.085
(58) Field of Classification Search .................. 257/1, 257/12, 13, 44, 76, 201, 607, 613, 615, 616; 438/752, 933
See application file for complete search history.

(56) References Cited

U.S. PATENT DOCUMENTS

2005/0040413 A1* 2/2005 Takahashi et al. ............. 257/96

OTHER PUBLICATIONS

A.J. Ptak et al., Journal of Crystal Growth 251,2003,pp. 392-398 (2003).*

A.A. Bonapasta et al., Phys. Rev. B, 69, 115207 (2004).*
A.J. Ptak, et al., Journal of Crystal Growth 251, 2003, pp. 392-398.
Masahiko Kondow, et al., Jpn. J. Appl. Physica. vol. 38, 1999, pp. L1355-L1356.
A. Polimeni, et al., Physical Review B, vol. 63, 2001, pp. 201304-1-201304-4(R).
A. Amore, et al., Physical Review B 69, 2004, pp. 115207-1-115207-11.

* cited by examiner

*Primary Examiner*—A. Sefer
*Assistant Examiner*—Scott R Wilson
(74) *Attorney, Agent, or Firm*—Smith, Gambrell & Russell, LLP

(57) ABSTRACT

A semiconductor optical device comprises a first conductive type III-V compound semiconductor layer, a second conductive type III-V compound semiconductor layer, and an active region. The first conductive type III-V compound semiconductor layer is provided on a substrate. The second conductive type III-V compound semiconductor layer is provided on the substrate. The active region is provided between the first conductive type III-V compound semiconductor layer and the second conductive type III-V compound semiconductor layer. The active region includes a III-V compound semiconductor layer. The III-V compound semiconductor layer contains nitrogen and arsenic as V-group element. The hydrogen concentration of the III-V compound semiconductor layer is greater than $6 \times 10^{16}$ cm$^{-3}$. The III-V compound semiconductor layer of the active region is doped with n-type dopant.

18 Claims, 5 Drawing Sheets

(A)

(B)

(A)

(B)

SEMICONDUCTOR OPTICAL DEVICE

BACKGROUND OF THE INVENTION

1. Field of the Invention

The present invention relates to a semiconductor optical device.

2. Related Background Art

Publication 1 (A. J. Ptak et al., J. Cryst. Growth 251 (2003) 392-398) discloses comparison in crystal quality between GaInNAs semiconductors grown by MBE and MOCVD. The hydrogen concentration of the GaInNAs semiconductor by MOCVD is $1 \times 10^{19}$ cm$^{-3}$ and the hydrogen concentration of the GaInNAs semiconductor by MBE is below detection limit of secondary ion mass spectroscopy analysis.

Publication 2 (Masahiko KONDOW et al., Jpn. J. Appl. Phys. 38 (1999) L1355-L1356) discloses the results of continuous current test of a semiconductor laser having GaInNAs semiconductor grown by MBE. The characteristics of the semiconductor laser are not degraded even after 1000 hour continuous current supply.

Publication 3 (A. Polimeni, et al., Phys. Rev. B 63 (2001) 201304(R)) discloses the effect of the implantation of hydrogen ion to GaInNAs semiconductor grown by MBE. As the concentration of hydrogen is increased in the GaInNAs semiconductor, its bandgap Eg is also increased and the intensity of the photo luminescence is lowered. N-clusters are combined with hydrogen atoms to generate nonradiative centers.

Publication 4 (A. Amore Bonapasta et al., Phys. Rev. B 69 (2004) 115207) discloses the relationship between the formations of N—H bond and N—H$_2$ bond in GaPN and the fermi level thereof. Publication 4 also discloses theoretical analysis of the combination between nitrogen and hydrogen.

SUMMARY OF THE INVENTION

Hydrogen atoms are inevitably contained in GaInNAs crystal grown by MOCVD method, and these hydrogen atoms lower the photo luminescence intensity of the GaInNAs crystal. The degradation of characteristics of semiconductor lasers using GaInNAs crystal grown by MBE method is smaller in a continuous current test as compared to GaInNAs crystal grown by MOVPE method.

What is needed is to reduce the effect that hydrogen in III-V compound semiconductor material containing nitrogen and arsenic, such as GaInNAs and GaNAs, causes thereon.

It is an object of the present invention to provide a semiconductor optical device that reduces the effect by hydrogen in III-V compound semiconductor material containing nitrogen and arsenic.

According to one aspect of the present invention, a semiconductor optical device comprises a first conductive type III-V compound semiconductor layer, a second conductive type III-V compound semiconductor layer, and an active region. The first conductive type III-V compound semiconductor layer is provided on a substrate. The second conductive type III-V compound semiconductor layer is provided on the substrate. The active region is provided between the first conductive type III-V compound semiconductor layer and the second conductive type III-V compound semiconductor layer. The active region includes a III-V compound semiconductor layer. The III-V compound semiconductor layer contains nitrogen and arsenic as V-group element. The hydrogen concentration of the III-V compound semiconductor layer is greater than $6 \times 10^{16}$ cm$^{-3}$. The III-V compound semiconductor layer of the active region is doped with n-type dopant.

In the semiconductor optical device according to the present invention, the n-type dopant concentration of the III-V compound semiconductor layer is equal to or lower than $3 \times 10^{18}$ cm$^{-3}$.

In the semiconductor optical device according to the present invention, the III-V compound semiconductor layer of the active region is a well layer, and the active region includes a barrier layer of III-V compound semiconductor.

In the semiconductor optical device according to the present invention, the III-V compound semiconductor layer of the active region is made of GaInNAs semiconductor.

In the semiconductor optical device according to the present invention, the III-V compound semiconductor layer of the active region is a well layer, and the active region includes a barrier layer of III-V compound semiconductor.

In the semiconductor optical device according to the present invention, the III-V compound semiconductor layer of the active region is made of GaNAs semiconductor.

In the semiconductor optical device according to the present invention, the III-V compound semiconductor layer of the active region is a well layer, and the active region includes a barrier layer of III-V compound semiconductor.

In the semiconductor optical device according to the present invention, the III-V compound semiconductor layer of the active region is made of GaInNAsSb.

In the semiconductor optical device according to the present invention, the III-V compound semiconductor layer of the active region is a well layer, and the active region includes a barrier layer of III-V compound semiconductor.

In the semiconductor optical device according to the present invention, the barrier layer is made of GaAs.

In the semiconductor optical device according to the present invention, the GaAs for the barrier layer is undoped.

In the semiconductor optical device according to the present invention, the n-type dopant is silicon.

In the semiconductor optical device according to the present invention, the number of N—H$_2$ bonds in the III-V compound semiconductor layer of the active region is greater than the number of N—H bonds therein.

In the semiconductor optical device according to the present invention, the III-V compound semiconductor layer of the active region contains carbon atoms, and the III-V compound semiconductor layer of the active region has n-conductive type.

In the semiconductor optical device according to the present invention, the substrate is made of GaAs.

In the semiconductor optical device according to the present invention, the III-V compound semiconductor layer of the active region contains at least one of Ga, B, Al, In and Tl as III-group element.

In the semiconductor optical device according to the present invention, the III-V compound semiconductor layer of the active region contains As and N and can also contain at least one of P, Sb and Bi.

In the semiconductor optical device according to the present invention, the semiconductor optical device includes a laser diode, and the laser diode has the active region, the first conductive type III-V compound semiconductor layer and the second conductive type III-V compound semiconductor layer.

The semiconductor optical device according to the present invention comprises a first conductive type III-V compound semiconductor layer, a second conductive type III-V compound semiconductor layer, and an active region. The first conductive type III-V compound semiconductor layer is provided on a substrate. The second conductive type III-V compound semiconductor layer is provided on the substrate. The active region is provided between the first conductive type III-V compound semiconductor layer and the second conductive type III-V compound semiconductor layer. The active region includes a III-V compound semiconductor layer. The III-V compound semiconductor layer contains nitrogen and arsenic as V-group element. The III-V compound semiconductor layer of the active region is doped with n-type dopant. The III-V compound semiconductor layer of the active region has n-conductive type. The III-V compound semiconductor layer of the active region containing carbon and hydrogen.

In the semiconductor optical device according to the present invention, the hydrogen concentration of the III-V compound semiconductor layer of the active region is greater than $6 \times 10^{16}$ cm$^{-3}$.

BRIEF DESCRIPTION OF THE DRAWINGS

The above objects and other objects, features, and advantages of the present invention will be understood easily from the following detailed description of the preferred embodiments of the present invention with reference to the accompanying drawings.

DETAILED DESCRIPTION OF THE PREFERRED EMBODIMENTS

The teachings of the present invention will readily be understood in view of the following detailed description with reference to the accompanying drawings illustrated by way of example. Referring to the accompanying drawings, embodiments of a semiconductor optical device of the present invention will be explained. When possible, parts identical to each other will be referred to with symbols identical to each other.

Figure 1:
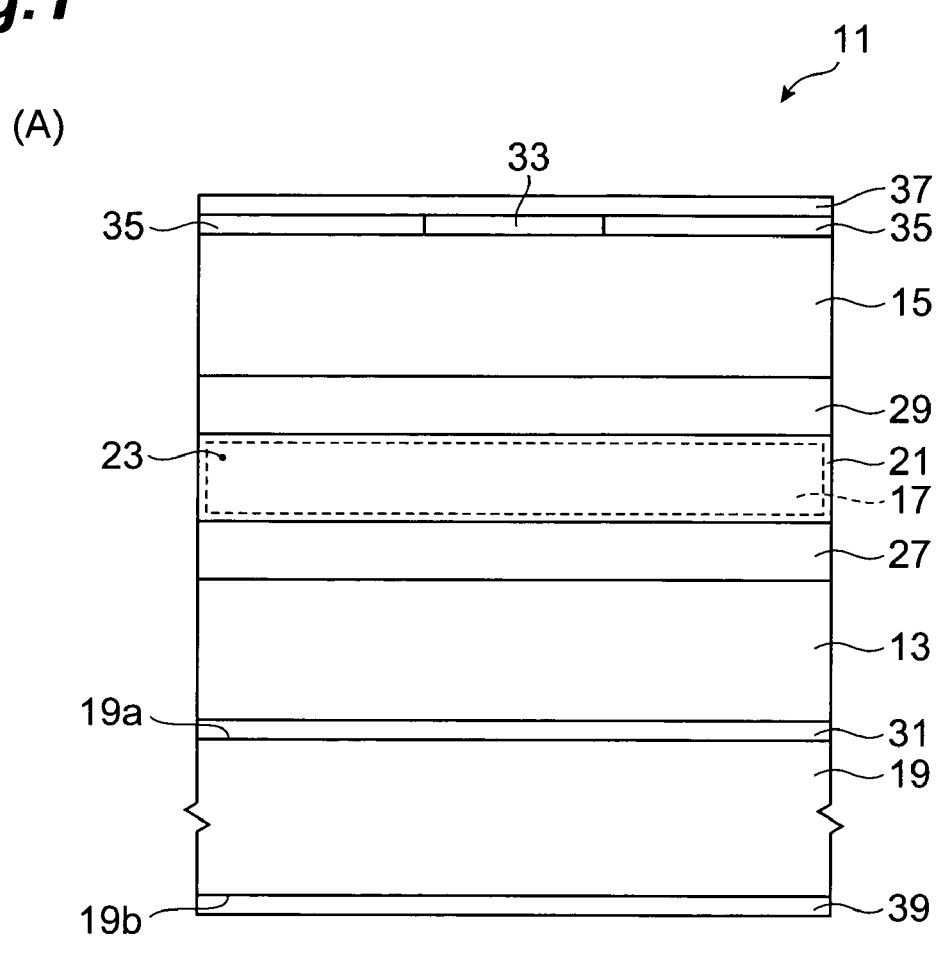
FIG. 1 is a view showing the structure of a semiconductor optical device according to the present embodiment.
Figure 1:
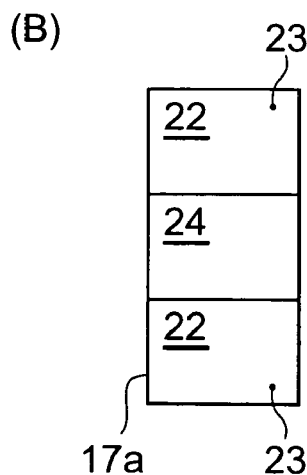

FIG. 1 is a view showing the structure of a semiconductor optical device according to the present embodiment. Referring to part (A) in FIG. 1, a semiconductor 11 includes a first conductive type III-V compound semiconductor layer 13, a second conductive type III-V compound semiconductor layer 15, and an active region 17. The first conductive type III-V compound semiconductor layer 13 is provided on the substrate 19. The second conductive type III-V compound semiconductor layer 15 is provided on the substrate 19. The active region 17 is provided between the first conductive type III-V compound semiconductor layer 13 and the second conductive type III-V compound semiconductor layer 15, and includes a III-V compound semiconductor layer 21 containing nitrogen (N) and arsenic (As) as V-group element. The hydrogen concentration of the III-V compound semiconductor layer 21 is greater than $6 \times 10^{16}$ cm$^{-3}$, and is doped with n-type dopant 23.

In the semiconductor optical device 11, if the conductivity type of the active region 17 is n-type, then N—H$_2$ bond is preferentially formed as compared to the formation of N—H bond. Accordingly, dangling bonds of III-group element are not generated and thus the generation of nonradiative centers due to N—H bonds is prevented, thereby reducing the deterioration of the optical efficiency. The continuous current test hardly deteriorates the characteristics of the semiconductor optical device 11.

The active region 17 in the semiconductor optical device 11 is not limited to a bulk structure, and a quantum well structure may be used for the active region 17. For example, as shown in part (B) of FIG. 1, the active region 17 includes a well layer 22 of III-V compound semiconductor containing nitrogen (N) and arsenic (As) as V group element and a barrier layer 24. The well layer 22 is doped with n-type dopant 23.

The semiconductor optical device 11 includes a first optical guide layer 27 provided between the active region 17 and the first conductive type III-V compound semiconductor layer 13, and the semiconductor optical device 11 includes a second optical guide layer 29 provided between the active region 17 and the second conductive type III-V compound semiconductor layer 15. According to this structure, the confinement of carriers is separately performed from the confinement of light.

In the semiconductor optical device 11, the substrate 19 is conductive, and, for example, GaAs substrates can be used as the substrate 19. If required, a buffer layer 31 can be provided on the GaAs surface 19a of the substrate 19. The semiconductor optical device 11 includes a contact layer 33 provided on the second conductive type III-V compound semiconductor layer 15. The contact layer 33 has a stripe shape for confining current to a part of the active region 17. One part of the second conductive type III-V compound semiconductor layer 15 is covered with the contact layer 33, and another part thereof is covered with an insulator 35. A first electrode 37, such as a cathode electrode, is provided on the contact layer 33, and a second electrode 39, such as an anode electrode, is provided on the backside of the substrate 19.

In the semiconductor optical device 11, since the n-type active layer of III-V compound semiconductor containing nitrogen element and arsenic element is used, N—H$_2$ bonds are preferentially formed and N—H bonds are not formed during energization even in the active layer containing hydrogen atoms. The N—H bonds induce the generation of III group element dangling bonds to form nonradiative centers in the above III-V compound semiconductor, thereby deteriorating it. But, since the N—H$_2$ bonds do not induce the generation of dangling bonds of III group element, the N—H$_2$ bonds do not help the increase of dangling bonds of III group element. Accordingly, the present embodiment provides the active region having high reliability and exhibiting less deterioration even after continuous current supply. The active region has an excellent emitting efficiency. An MOVPE furnace is used for the crystal growth in the fabrication of the semiconductor optical device, and hydrogen atoms are easily mixed into semiconductor containing nitrogen and arsenic during its growth to form more N—H bonds therein. Contrary, the n-type active layer lowers the possibility of generation of N—H bonds. MOVPE methods provide higher throughput as compared to MBE methods, and provide the manufacturing of semiconductor devices at low cost.

In the semiconductor optical device 11, the n-type dopant concentration of the semiconductor layer 21 can be equal to or greater than $1 \times 10^{15}$ cm$^{-3}$. According to the semiconductor optical device 11, the number of the III group dangling bonds is not increased. In the semiconductor optical device 11, the n-type dopant concentration of the semiconductor layer 21 can be equal to or less than $3 \times 10^{18}$ cm$^{-3}$. Alternatively, the n-type dopant concentration of the well layer 22 can be equal to or less than $3 \times 10^{18}$ cm$^{-3}$. According to the semiconductor optical device 11, the characteristics of the semiconductor optical device 11 is not degraded because absorbing light associated with the semiconductor device 11 by free carriers is negligible.

In the semiconductor optical device 11, the active region 17 can include a III-V compound semiconductor layer that contains arsenic (As) and nitrogen (N) as V-group element and at least one of the following III-group element: Ga, B, Al, In, and Tl. The III-V compound semiconductor layer may contain at least one of the following V-group element: P, Sb, and Bi. GaInNAs semiconductor, GaNAs semiconductor or GaInNAsSb semiconductor can be used therefor. For example, GaInNAs semiconductor, GaNAs semiconductor or GaInNAsSb semiconductor can be used for the semiconductor layer 21.

One example of the semiconductor laser is as follows:
first conductive type III-V compound semiconductor 13:
   n-AlGaAs cladding layer,
second conductive type III-V compound semiconductor 15:
   p-AlGaAs cladding layer,
substrate 19: n-GaAs substrate,
active region 17:
   well layer 22: n-GaInNAs layer,
   barrier layer 24: undoped GaAs layer,
first optical guide layer 27: undoped GaAs layer,
second optical guide layer 29: undoped GaAs layer,
buffer layer 31: n-GaAs layer,
contact layer 33: p-GaAs layer,
first electrode: cathode electrode,
second electrode: anode electrode.

EXAMPLE

Figure 2:
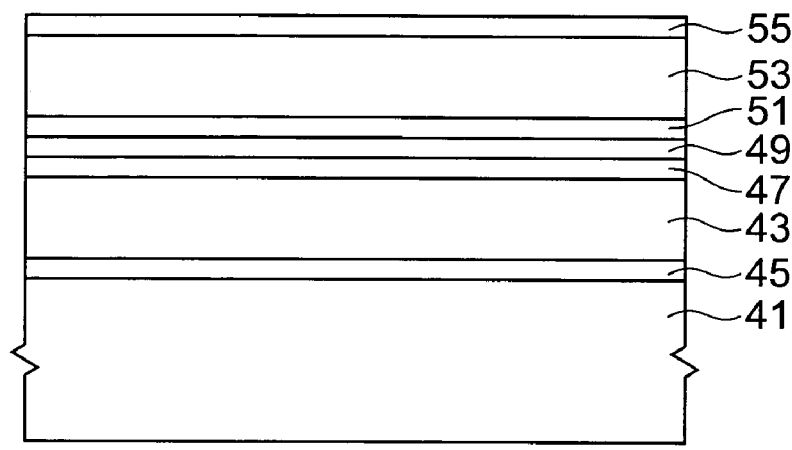
FIG. 2 is a view showing the structure of a semiconductor optical device according to the present embodiment.
Figure 2:
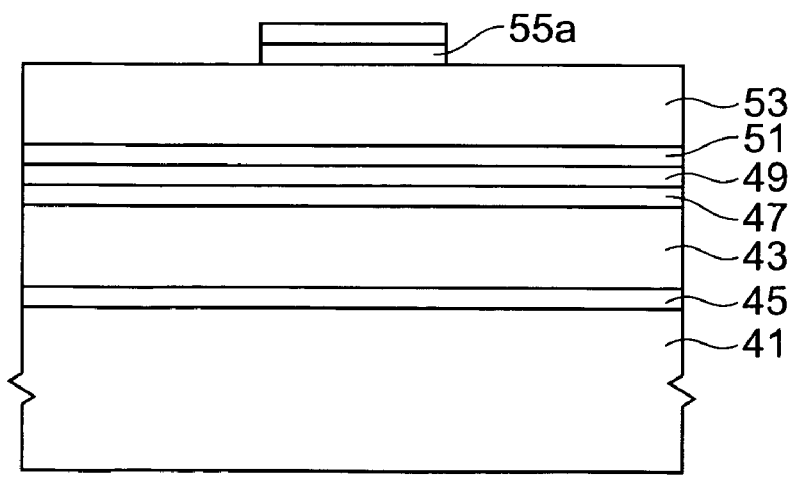

As shown in part (A) of FIG. 2, an epitaxial substrate is formed by low pressure MOVPE method, and the epitaxial substrate includes a laser structure of an active region having double quantum well (DQW) layers of GaInNAs/GaAs structure. Si-doped (100) GaAs substrate 41 mis oriented two degrees toward the <110> direction is used. Triethylgallium (TEGa), trimethylindium (TMIn), dimethylhydrazine (DMHy) and tertiarybutylarsine (TBAs) are used as gallium (Ga) source, indium (In) source, nitrogen (N) source and arsenic (As) source, respectively. Tetraethylsilane (TeESi) and diethylzinc (DEZn) are used as silicon (Si) source and zinc (Zn) source, respectively. An n-type AlGaAs cladding layer 43 is formed on the substrate 41. If required, a buffer layer 45 is grown on the GaAs substrate prior to the formation of the n-type AlGaAs cladding layer 43. After forming an undoped GaAs SCH layer 47, an active region 49 is formed. The n-type cladding layer is doped with n-type dopant, for example, Si.

The active region 49 has a double quantum well structure (DQW). In the formation of the active region 49, well layers of 7 nm thickness and a barrier layer of 8 nm thickness are deposited. The composition of the well layers is $Ga_{0.66}In_{0.34}N_{0.01}As_{0.99}$. These GaInNAs well layers are doped with Si and the Si concentration of the well layers is about $2\times10^{17}$ $cm^{-3}$. According to results of SIMS analysis, the concentration of carbon (C) taken in during the well layer growth is about $1\times10^{17}$ $cm^{-3}$. Consequently, the electron carrier concentration of the GaInNAs well layer is $1\times10^{17}$ $cm^{-3}$. In the fabrication of an epitaxial substrate having a laser structure in which the well layers are intentionally doped with Si, the growth temperature is 510 degrees Celsius, the growth rate is 0.9 micrometers per hour, [DMHy]/([DMHy]+[TBAs]) ratio is 0.99, and the growth pressure is 10132 Pa (76 Torr).

An undoped GaAs SCH layer 51 is formed on the active region 49. After forming the undoped GaAs SCH layer 51, a p-type AlGaAs cladding layer 53 is deposited. The thickness values of the SCH layer and the cladding layer are 140 nanometers and 1.5 micrometers, respectively. The p-type cladding layer is doped with zinc (Zn). After growing the cladding layer 53, a p-type contact layer 55 of 0.2 micrometer thickness is deposited.

Aside from the above, another epitaxial substrate is formed, and this epitaxial substrate has a laser structure in which the GaInNAs layers are not intentionally doped with Si. Carbon atoms corresponding to the carrier concentration of $1\times10^{-17}$ $cm^{-3}$ is inevitably taken into the well layers, and the conductivity of the well layers becomes p-type. Both epitaxial substrates are annealed in the MOVPE furnace at the temperature of 670 degrees C. for ten minutes.

Figure 3:
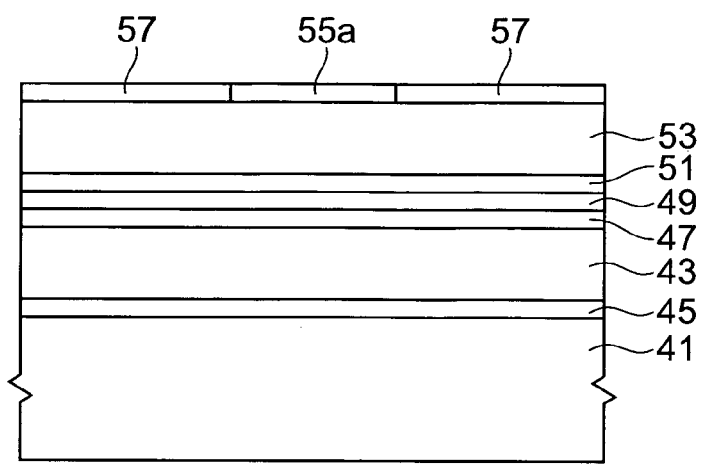
FIG. 3 is a view showing the structure of a semiconductor optical device according to the present embodiment.
Figure 3:
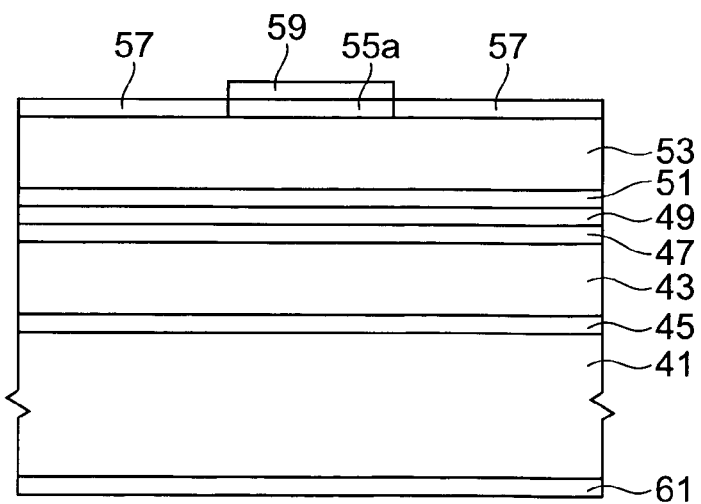

These epitaxial substrates as formed above are processed to form gain-guide structure semiconductor lasers from the respective epitaxial substrates. As shown in part (B) of FIG. 2, after patterning a photo-resist by photolithography, the contact layer 55 is processed by mesa-etching by use of the photo-resist to form a stripe contact layer 55a. The width of the stripe contact layer 55a is 5 micrometers. Thereafter, as shown in part (A) of FIG. 3, an insulating film, such as silicon nitride film, is formed on the whole surface of the wafer by plasma CVD method.. A resist mask having an opening on the stripe contact layer 55a is formed by photolithography. By use of the mask, a part of the insulating film on the stripe contact layer 55a is etched to form a passivation film 57. As shown in part (B) of FIG. 3, a cathode electrode 59 is formed on the contact layer 55a and an anode electrode 61 is formed on the backside of the GaAs substrate. After the above process steps, the laser fabrication is completed.

After the above wafer process, the processed wafer is cleaved into laser bars each having the width of 600 micrometers. These laser bars are used for laser characteristics measurements and continuous current tests.

Figure 4:
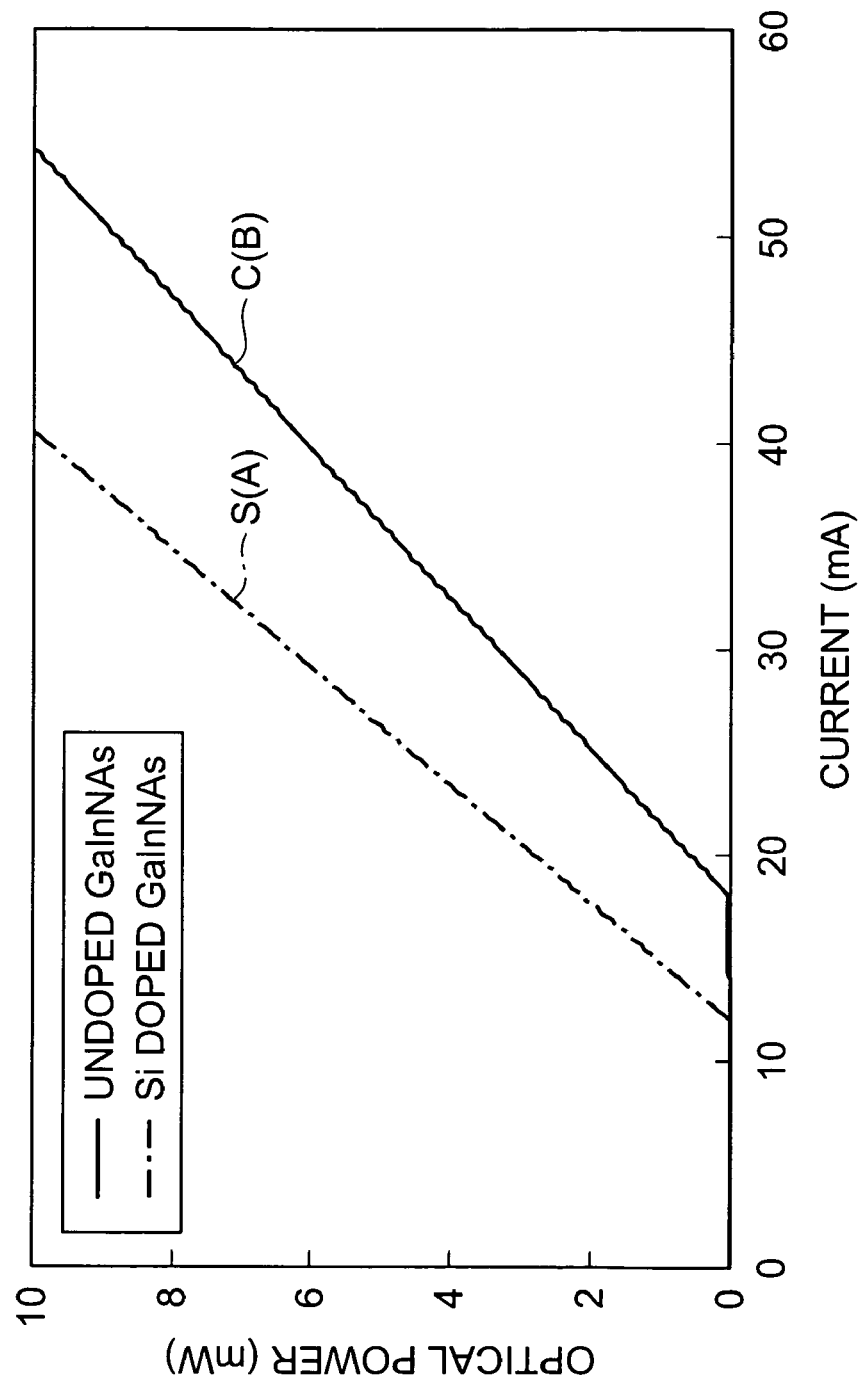
FIG. 4 is a graph showing curve S indicating current-optical output characteristics of semiconductor laser A including a GaInNAs well layer doped with silicon, and curve C indicating current-optical output characteristics in semiconductor laser B including a GaInNAs well layer that is not intentionally doped with silicon.

FIG. 4 is a graph showing curve S and curve C. Curve S indicates current-optical output characteristics in semiconductor laser A including a GaInNAs well layer doped with silicon, and curve C indicates current-optical output characteristics in semiconductor laser B including a GaInNAs well layer that is not intentionally doped with silicon. These characteristics curves indicate results measured at the temperature of 25 degrees Celsius. Comparison between curves S and C reveals that the threshold current of the semiconductor laser A is lower and that its slope efficiency is higher as compare to the semiconductor laser B.

Figure 5:
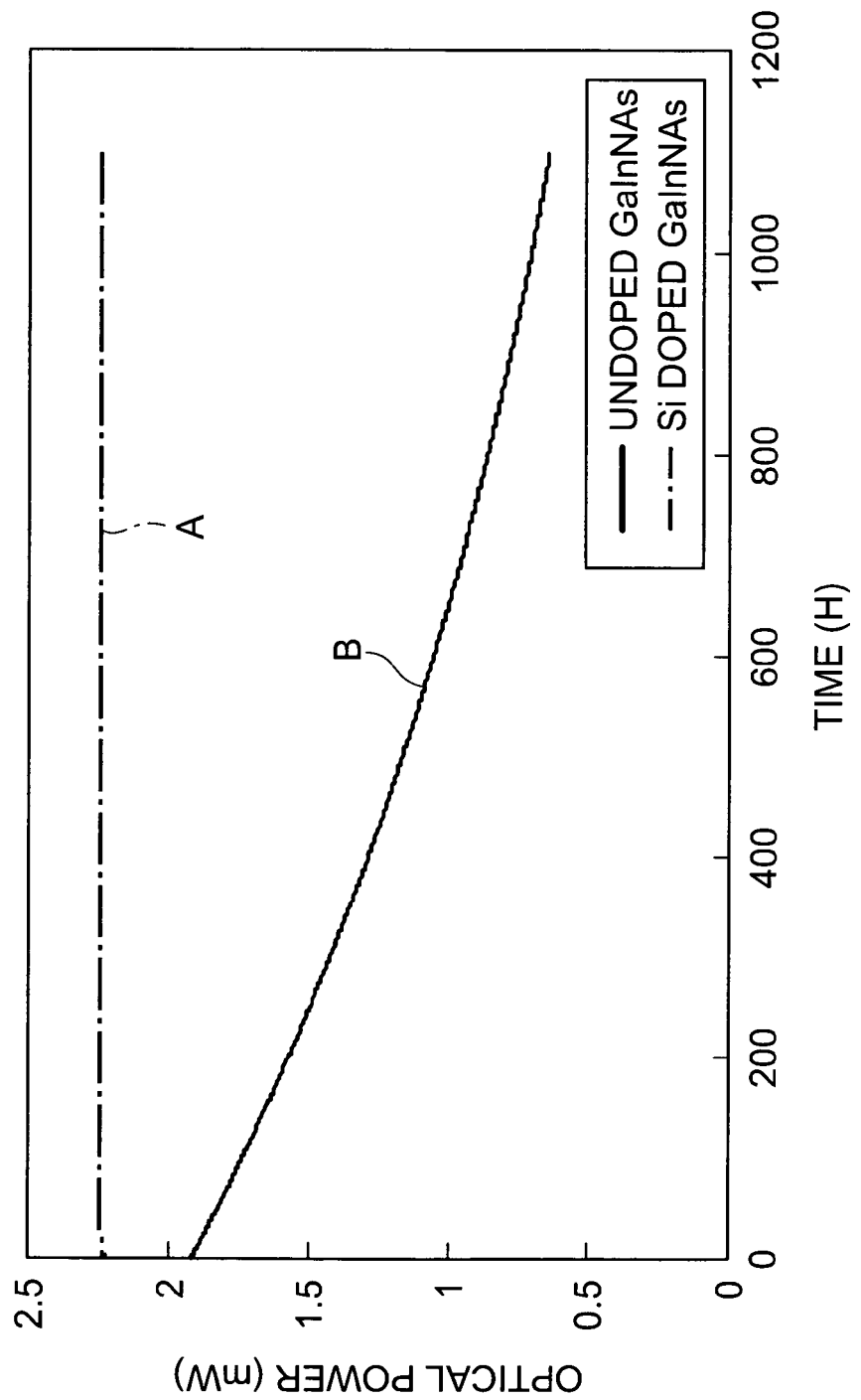
FIG. 5 is a graph showing results of a continuous current test for semiconductor lasers A and B.

FIG. 5 is a graph showing continuous current supply tests for semiconductor lasers A and B. Condition for these tests is as follows: supplying current of 100 mA; ambient temperature of 25 degrees Celsius. The results of the tests show that the optical output for the semiconductor B is decreased from the beginning and its deterioration due to the energization is not small. Contrary, the results of the tests show that the optical output for the semiconductor A is stabilized for more than 1000 hours from the beginning and its deterioration due to the electrical energization is small. As understood from the above results, the n-type GaInNAs permits the fabrication of a semiconductor laser having high reliability and excellent initial characterization.

When III-V compound semiconductor is grown by MOVPE method, hydrogen (H) atoms and carbon (C) atoms are inevitably taken thereinto during the growth. The hydrogen concentration may depend on the kind of III-V compound semiconductors and is greater than $1\times10^{18}$ $cm^{-3}$. Since carbon atoms are inevitably mixed into GaInNAs semiconductor, the conductivity of the resultant GaInNAs is p-type if the GaInNAs is not intentionally doped with n-type dopant. Since N—H bonds are dominantly formed from hydrogen and nitrogen atoms taken from the atmosphere during the growth, these hydrogen and nitrogen atoms induce the generation of defects coming from dangling bonds of III-group atoms. Since these dangling bond defects act as nonradiative centers, the threshold current for lasing oscillation is increased, thereby decreasing the slope efficiency (conversion efficiency of injected current to optical output).

In GaInNAs, formation energy for N—H bond depends on the carrier concentration thereof and N—$H_2$ bond is more stable than N—H bond in n-type GaInNAs. Since the semiconductor laser A includes an n-type GaInNAs layer, N—$H_2$ bonds are dominantly created from hydrogen and nitrogen atoms taken from the atmosphere for the growth and dangling bonds are less created from the taken atoms, thereby preventing the generation of nonradiative centers. Therefore, the initial characterization (low threshold current and high slope efficiency) of the semiconductor laser A is superior to a semiconductor laser including an undoped GaInNAs layer.

Having described and illustrated the principle of the invention in a preferred embodiment thereof, it is appreciated by those having skill in the art that the invention can be modified in arrangement and detail without departing from such principles. Details of structures of these devices can be modified as necessary. For example, although semiconductor optical device, such as semiconductor laser is described in the embodiment, the present invention is not limited to the specific examples disclosed in the embodiments. We therefore claim all modifications and variations coming within the spirit and scope of the following claims.

What is claimed is:

1. A semiconductor optical device comprising:
   a first conductive type III-V compound semiconductor layer provided on a substrate;
   a second conductive type III-V compound semiconductor layer provided on the substrate; and
   an active region provided between the first conductive type III-V compound semiconductor layer and the second conductive type III-V compound semiconductor layer, the active region including a III-V compound semiconductor layer, the III-V compound semiconductor layer containing nitrogen and arsenic as the V-group element, a hydrogen concentration of the III-V compound semiconductor layer of the active region being greater than $6 \times 10^{16}$ cm$^{-3}$, the III-V compound semiconductor layer of the active region being doped with n-type dopant, an n-type dopant concentration of the III-V compound semiconductor layer of the active region being equal to or lower than $3 \times 10^{18}$ cm$^{-3}$ and equal to or greater than $1 \times 10^{15}$ cm$^{-3}$, the number of N—H$_2$ bonds in the III-V compound semiconductor layer of the active region being greater than the number of N—H bonds therein, and the n-type dopant concentration of the III-V compound semiconductor layer being greater than a carbon concentration of the III-V compound semiconductor layer of the active region.

2. The semiconductor optical device according to claim 1, wherein the n-type dopant concentration of the III-V compound semiconductor layer is equal to or lower than $3 \times 10^{18}$ cm$^{-3}$.

3. The semiconductor optical device according to claim 1, wherein the III-V compound semiconductor layer of the active region is a well layer, and the active region includes a barrier layer of III-V compound semiconductor.

4. The semiconductor optical device according to claim 1, wherein the III-V compound semiconductor layer of the active region is made of GaInNAs semiconductor.

5. The semiconductor optical device according to claim 4, wherein the III-V compound semiconductor layer of the active region is a well layer, and the active region includes a barrier layer of III-V compound semiconductor.

6. The semiconductor optical device according to claim 1, wherein the III-V compound semiconductor layer of the active region is made of GaNAs semiconductor.

7. The semiconductor optical device according to claim 6, wherein the III-V compound semiconductor layer of the active region is a wall layer, and the active region includes a barrier layer of III-V compound semiconductor.

8. The semiconductor optical device according to claim 1, wherein the III-V compound semiconductor layer of the active region is made of GaInNAsSb.

9. The semiconductor optical device according to claim 8, wherein the III-V compound semiconductor layer of the active region is a well layer, and the active region includes a barrier layer of III-V compound semiconductor.

10. The semiconductor optical device according to claims 4, 6 or 8, wherein the barrier layer is made of GaAs.

11. The semiconductor optical device according to claim 10, wherein the GaAs for the barrier layer is undoped.

12. The semiconductor optical device according to claim 1, wherein the n-type dopant is silicon.

13. The semiconductor optical device according to claim 1, wherein the substrate is made of GaAs.

14. The semiconductor optical device according to claim 1, wherein the III-V compound semiconductor layer of the active region contains at least one of Ga, B, Al, In and Tl as III-group element.

15. The semiconductor optical device according to claim 1, wherein the III-V compound semiconductor layer of the active region contains at least one of P, Sb and Bi.

16. The semiconductor optical device according to claim 1, wherein the semiconductor optical device includes a laser diode, and the laser diode has the active region, the first conductive type III-V compound semiconductor layer and the second conductive type III-V compound semiconductor layer.

17. A semiconductor optical device comprising:
    a first conductive type III-V compound semiconductor layer provided on a substrate;
    a second conductive type III-V compound semiconductor layer provided on the substrate; and
    an active region provided between the first conductive type III-V compound semiconductor layer and the second conductive type III-V compound semiconductor layer, the active region including a III-V compound semiconductor layer, the III-V compound semiconductor layer containing nitrogen and arsenic as V-group element, and the III-V compound semiconductor layer of the active region being doped with n-type dopant, the III-V compound semiconductor layer of the active region having n-conductive type, and the III-V compound semiconductor layer of the active region containing carbon and hydrogen, an n-type dopant concentration of the III-V compound semiconductor layer being equal to or lower than $3 \times 10^{18}$ cm$^{-3}$ and equal to or greater than $1 \times 10^{15}$ cm$^{-3}$, the number of N—H$_2$ bonds in the III-V compound semiconductor layer of the active region is greater than the number of N—H bonds therein, and the n-type dopant concentration of the III-V compound semiconductor layer being greater than a carbon concentration of the III-V compound semiconductor layer.

18. The semiconductor optical device according to claim 17, wherein the hydrogen concentration of the III-V compound semiconductor layer of the active region is greater than $6 \times 10^{16}$ cm$^{-3}$.

* * * * *